United States Patent [19]

Suzuki et al.

[11] Patent Number: 5,328,513
[45] Date of Patent: Jul. 12, 1994

[54] APPARATUS FOR PRODUCING DIES FOR EXTRUDING CERAMIC HONEYCOMB BODIES

[75] Inventors: Kazuo Suzuki, Inazawa; Kenji Arai, Nagoya; Hiroshi Ueda, Tokyo, all of Japan

[73] Assignee: NGK Insulators, Ltd., Japan

[21] Appl. No.: 86,873

[22] Filed: Jul. 8, 1993

Related U.S. Application Data

[62] Division of Ser. No. 855,860, Mar. 23, 1992, Pat. No. 5,256,449.

[30] Foreign Application Priority Data

Mar. 25, 1991 [JP] Japan .................................. 3-082998

[51] Int. Cl.$^5$ ......................................... C23C 16/00
[52] U.S. Cl. ......................................... 118/715
[58] Field of Search .............. 427/248.1, 237, 255; 118/715

[56] References Cited

U.S. PATENT DOCUMENTS

| 4,574,459 | 3/1986 | Peters | 425/464 |
| 4,615,294 | 10/1986 | Scapple | 118/719 |

FOREIGN PATENT DOCUMENTS

| 149318 | 7/1985 | European Pat. Off. . |
| 3431892 | 3/1986 | Fed. Rep. of Germany . |
| 60-145804 | 8/1985 | Japan . |
| 61-39167 | 2/1986 | Japan . |
| 61-69968 | 4/1986 | Japan . |
| 64-80019 | 3/1989 | Japan ................... 118/715 |
| 3-281102 | 12/1991 | Japan . |
| 3-281306 | 12/1991 | Japan . |

OTHER PUBLICATIONS

Derwent Japanese Patent Report, accession No. 88-202201 [29] Derwent Publications Ltd., London, GB; & JP-A-63-140087 (Ishikawajima-Harima Juko).

*Primary Examiner*—Richard Bueker
*Attorney, Agent, or Firm*—Parkhurst, Wendel & Rossi

[57] ABSTRACT

A method for producing dies for extruding ceramic honeycomb structural bodies is provided which can simultaneously produce in at least one stage a number of dies having a uniform vapor deposited film formed on the dies by chemical vapor deposition, and which has high production efficiency and decreases the production cost of the dies. The method includes the steps of forming die members having extrusion grooves and a plurality of holes for supplying a batch of ceramic raw materials respectively communicated with the extrusion grooves, and coating the die members with an abrasive-resistant material by a chemical vapor deposition operation, including forming the coating of an abrasive-resistant material on a plurality of die members simultaneously by chemical vapor depositing, while regulating a raw material gas for the chemical vapor deposition supplied from gas discharge holes of a rotatable raw material gas inlet pipe to flow to the die members.

3 Claims, 4 Drawing Sheets

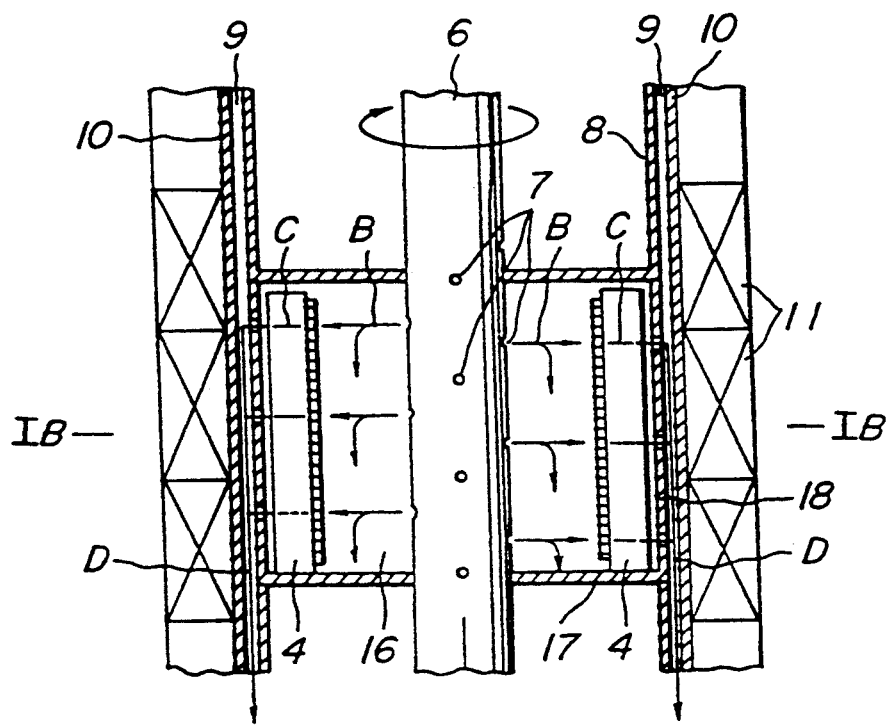
FIG_1A
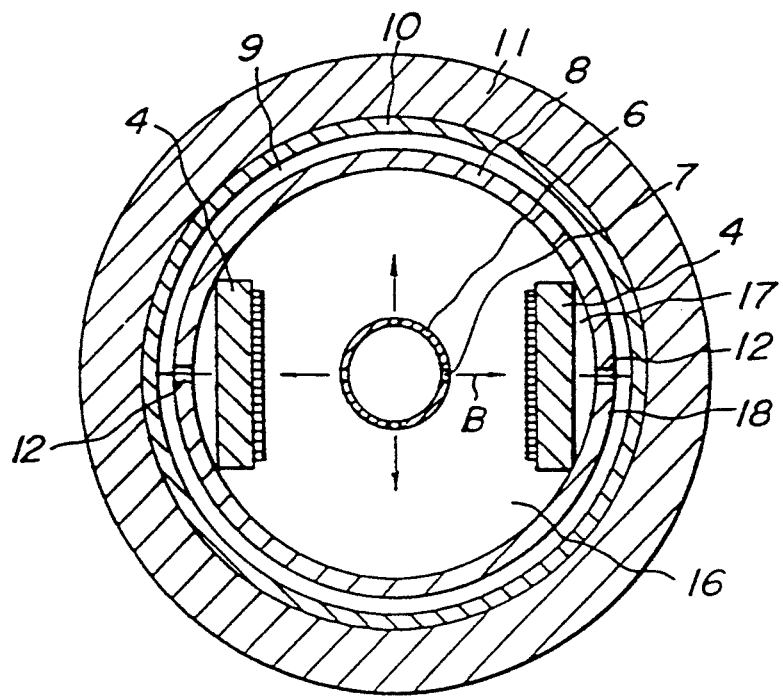
FIG_1B

FIG_2A
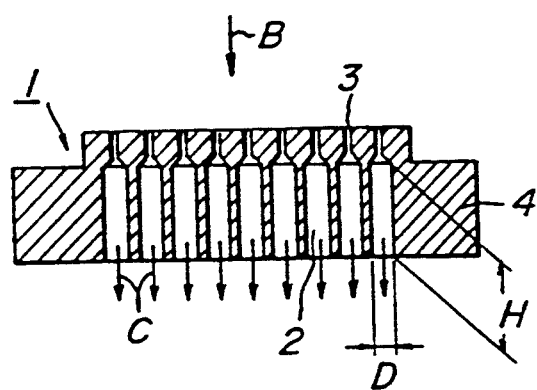
FIG_2B
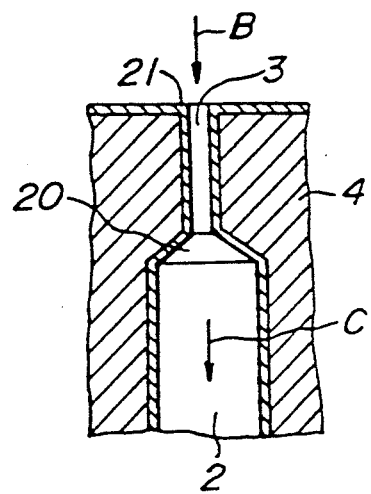

FIG_3
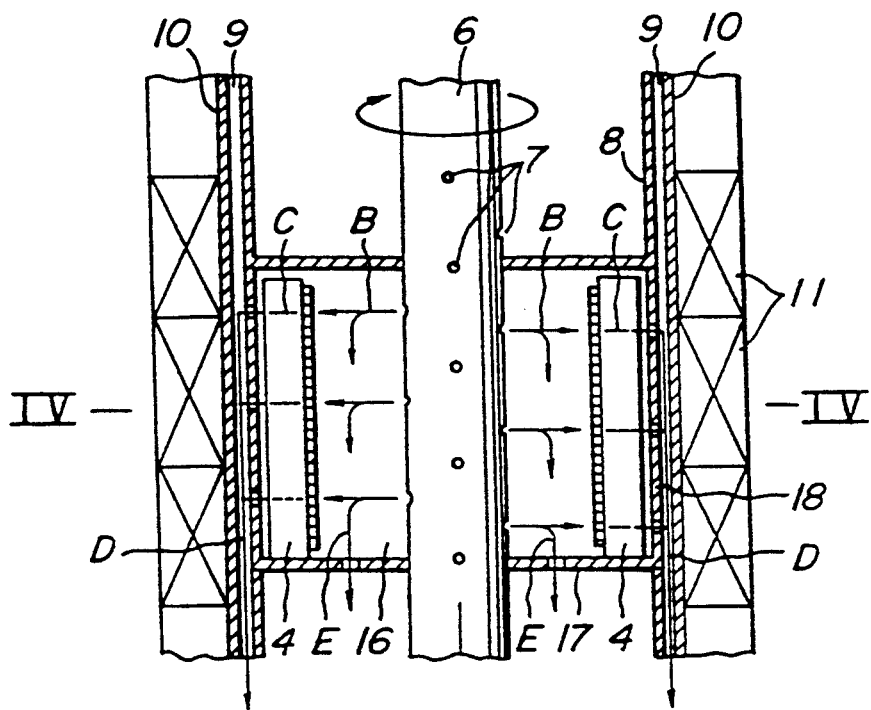
FIG_4
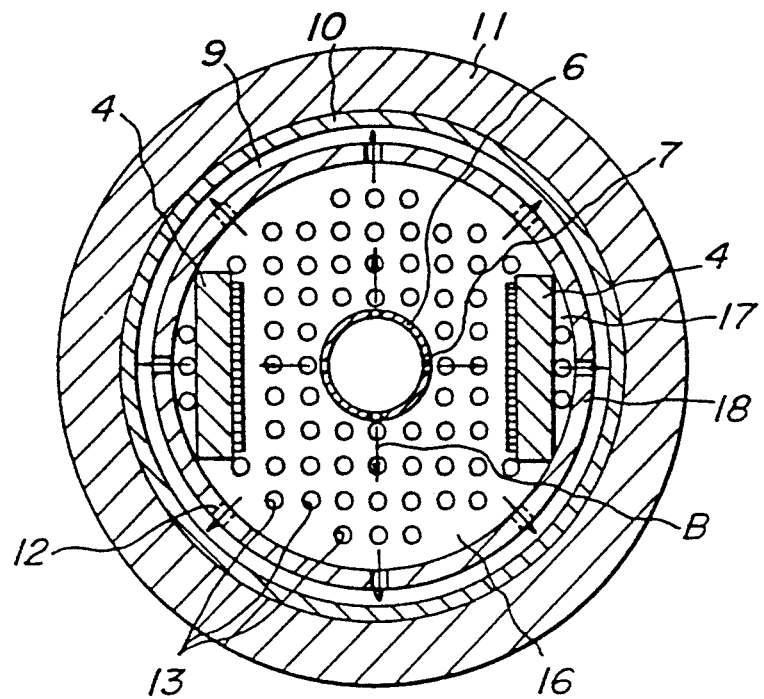

FIG_5
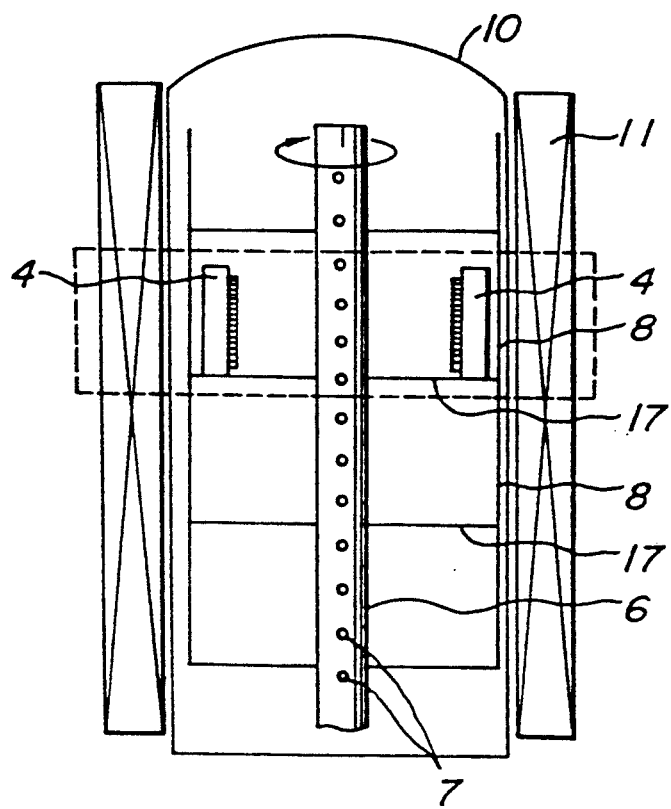

ary filed a
APPARATUS FOR PRODUCING DIES FOR EXTRUDING CERAMIC HONEYCOMB BODIES This is a Division of U.S. patent application Ser. No. 07/855,860 filed Mar. 23, 1992, now U.S. Pat. No. 5,256,449.

BACKGROUND OF THE INVENTION

1. Field of the Invention

The present invention elates to a method for producing dies for extruding ceramic honeycomb structural bodies which are used for heat exchangers, filters and catalyst carriers for purifying exhaust gases from internal combustion engines, more particularly such a type of die having an abrasive-resistant material coated on the surface thereof by chemical vapor deposition (CVD).

2. Related Art Statement

Heretofore, ceramic honeycomb structural bodies have been used for carriers of catalysts for purifying exhaust gases from internal combustion engines, filters for removing soot, rotary heat exchangers for recovering heat, or the like. Methods for producing a die used for producing such a type of honeycomb structural bodies by extrusion are described, for example, in JP-A-60-145,804 and JP-A-61-69,968, wherein techniques of subjecting the extrusion dies to chemical vapor deposition treatments are described. However, a chemical vapor deposition treatment is expensive in cost and uneconomical for treating a single die, and thus it is desired to treat as many extrusion dies as possible simultaneously in one operation.

Therefore, applicants' assignee previously filed a Japanese Patent Application No. 2-81,315 wherein a technique of simultaneously treating two dies is proposed. Namely, the chemical vapor deposition treatment is carried out into effect by providing two sheets of die members 4,4 in a space 16 for the CVD defined by a circumferential side wall 18 and a bottom plate (perforated plate) 17 of a device for vapor deposition, providing a rotatable tube 6 for supplying a raw material gas at the central axis of the device, and passing a raw material gas for CVD from holes 7 of the rotatable tube 6 in the direction of the arrow B towards extrusion grooves of the die members 4, 4, as shown in FIGS. 3 and 4. The whole structure of the vapor deposition device used is shown in FIG. 5 wherein the portion encircled by a dotted line (die member-accommodating portion) corresponds to the device of FIG. 3, and a portion other than the die member-accommodating portion forms also a space for CVD (CVD space) defined by the perforated plate 17 and the circumferential side wall 18 of the device similarly as in the die member accommodating portion for allowing the raw material gas to flow therethrough to perform another CVD treatment, for example, of other parts.

In the above described technique of simultaneously treating two sheets of die member, the raw material gas is discharged from the discharge holes 7 of the rotatable pipe 6 in the space 16 and flowed out from the CVD space 16 in a gas outlet space 9 via six holes 12 of eight holes 12 formed on the circumferential side wall 18 except those 2 holes formed behind the die members 4,4, as shown in FIG. 4. Therefore, a large amount of the raw material gas is exhausted from the gas outlet space 9 without participating in the chemical vapor deposition which is performed in the CVD space 16 to decrease an efficiency of utilizing the raw material gas. The tendency of decreasing the gas utilization efficiency is more remarkable, if the die member-non-accommodating portion of the CVD device shown in FIG. 5 is not used for another CVD treatment. Moreover, because the bottom plates 17 have many perforation holes 13, the raw material gas in the CVD space 16 is likely to flow to the vertical direction along a course of the arrows B and E shown in FIG. 3 and flow out therefrom to the exterior. Accompanying these phenomena, the flow of the raw material gas in the CVD space 16 is disturbed to occasionally form an uneven vapor deposited film of an abrasion resistant material of non-homogeneous thickness and/or quality on the die members 4,4. The non-homogeneity of the film likely occurs particularly at the rear side of the extrusion grooves of the die members. If the die having such uneven vapor deposited film is used to actually produce honeycomb structural bodies by extrusion operation, there often arise disadvantages in that the extruded bodies are bent or have undulations on the surface. Moreover, in the case when another die members 4,4 are arranged in other CVD space of the CVD device shown in FIG. 5 to form a multi stage type CVD device in order to increase the number of the die members that can be treated or vapor deposited simultaneously in one treatment, the thicknesses of the vapor deposited films become uneven depending on the position of the stages due to the aforementioned reasons.

SUMMARY OF THE INVENTION

An object of the present invention is to obviate the above drawbacks and disadvantages.

Another object of the present invention is to provide a method for producing dies for extruding ceramic honeycomb structural bodies which can simultaneously produce a plurality of die members having a vapor deposited film of a highly homogeneous property by a chemical vapor deposition process.

A further object of the present application will become apparent from the ensuing description and the attached claims and drawings.

Now, the above objects can be achieved by the present invention.

The present invention is a method for producing dies for extruding ceramic honeycomb structural bodies including the steps of forming die members having extrusion grooves and a plurality of holes for supplying a batch of ceramic raw materials respectively communicated with the extrusion grooves, and coating the die members with an abrasive-resistant material by a chemical vapor deposition operation, comprising forming the coating of the abrasive-resistant material on a plurality of the die member simultaneously by the chemical vapor deposition, while regulating a raw material gas for the chemical vapor deposition supplied from gas discharge holes of a rotatable raw material gas inlet pipe to flow to and through the die members.

BRIEF DESCRIPTION OF THE DRAWINGS

For a better understanding of the present invention, reference is made to the accompanying drawings in which:

FIG. 1A is a schematic cross-sectional view of a device for chemical vapor deposition used in the practice of the method of the present invention;

FIG. 1B is a schematic cross-sectional view thereof taken along the line B—B;

FIG. 2A is a schematic cross-sectional view of an extrusion die;

FIG. 2B is a partial enlarged view thereof;

FIG. 3 is a schematic cross-sectional view of a device for chemical vapor deposition used in a conventional method;

FIG. 4 is a schematic cross-sectional view thereof taken along the line A—A; and FIG. 5 is a schematic cross-sectional view of the whole structure of a device for chemical vapor deposition used in a conventional method, wherein the encircled portion can be substituted by the present invention.

Numbering in the drawings:
1—die for extruding ceramic honeycomb structural bodies
2—hole for supplying a batch of ceramic raw materials
3—extrusion groove
4—die member
6—a raw material gas inlet pipe
7—gas discharge hole
8—setter
9—gas outlet space
10—chamber
11—heater
12—round gas outlet hole
13—gas outlet hole
16—space for CVD
17—bottom plate
18—circumferential side wall
20—connecting portion connecting the batch supplying holes 2 and the extrusion grooves 3
21—abrasive-resistant coating layer

DETAILED DESCRIPTION OF THE INVENTION

Hereinafter, the present invention will be explained in more detail with reference to the accompanying drawings.

Referring to FIGS. 1A, 1B, 2A and 2B showing a device for chemical vapor deposition used in the practice of the present method and an embodiment of the extrusion die which is to be produced according to the present method, respectively, extrusion dies 1 have on a surface thereof a number of holes 2 for supplying a batch of ceramic raw materials, and on the other surface thereof a number of extrusion grooves 3 corresponding to a cross-sectional shape of a ceramic honeycomb structural body to be produced by the die, and connecting portions 20 between the batch supplying holes 2 and the extrusion grooves 3 which communicate them with each other. The die 1 comprises a die member 4 preferably made of a martensite type precipitation hardening series stainless steel, and preferably an abrasion-resistant coating layer 21 formed on the die member 4. The batch supplying holes 2 and the extrusion grooves 3 are formed in the extrusion die 1 by working the die 1.

The batch supplying holes 2 are formed in the extrusion die 1, in order to receive a ceramic batch introduced therein under pressure and to distribute the batch in the extrusion grooves 3. An inner diameter D, a depth H, number, and an arrangement of the batch supplying holes 2 relative to the extrusion grooves 3 are determined depending on raw materials of the ceramic batch, extruding forming condition, and shape factors of the honeycomb structural body, such as, cell density, wall thickness, and surface area thereof. Taking a cordierite honeycomb structural body of an outer diameter of 118 mm, a cell density of 400 cells/in$^2$, and a wall thickness of 0.15 mm as an example, about 3,400 batch supplying holes 2 having an inner diameter of about 1.0–1.5 mm and a depth H of 18–36 mm are formed in the die 1. The extrusion grooves 3 usually have a triangular, tetragonal, hexagonal, or other polygonal shape or a round shape corresponding to a shape of the cells in a cross-section of a honeycomb structural body to be produced by the die 1, and a width of usually 0.08–1.0 mm which defines a size of the partition walls of the honeycomb structural body. A considerable number of the extrusion groove 3 is necessary corresponding to the cell density of the honeycomb structural body and an outer diameter of the die 1, so that the extrusion grooves 3 are worked to a larger size than that desired by a wire-raw processing or an electrical discharge machining, as disclosed in JP-B-61-39,167. Such a method of working the extrusion grooves 3 to a larger size than that desired is also applicable to the working of the die 1 for forming the batch supplying holes 2.

In the device for chemical vapor deposition (to be referred to as "CVD device" hereinafter) shown in FIGS. 1A and 1B, the CVD device has a chamber 10, a heater 11 at the outer side of the chamber 10, a setter 8 at the inner side of the chamber 10, and a gas outlet space 9 between the chamber 10 and the inner setter 8. The chamber 10 has an inlet pipe 6 for supplying a raw material gas therein at the center of a CVD space 16 which is defined by the setter 8 and a bottom plate 17 for performing CVD having no perforation holes. The raw material gas supplying pipe 6 has at its outer wall a number of raw material gas discharge holes 7 at positions corresponding to the die members 4. The CVD space 16 accommodates a pair of die members 4 therein arranged in symmetrical to each other around the raw material gas supplying pipe 6, and each die member 4 is positioned substantially in parallel in vertical direction with the raw material gas supplying pipe 6, respectively. The die members 4 are positioned such that the extrusion grooves 3 thereof face to the raw material gas supplying pipe 6 and the ceramic batch supplying holes 2 face the circumferential side wall 18. The side wall 18 has round outlet holes 12 formed at positions behind the die members 4 and facing the ceramic batch supplying holes 2. The round holes 12 are omitted in FIG. 1A for simplification.

In performing chemical vapor deposition using the CVD device, a raw material gas consisting of a reactive gas and a carrier gas is discharged from the discharge holes 7 of the raw material supplying pipe 6 in a direction as shown by the arrow B, while rotating the pipe 6. The gas outlet space 9 is suctioned or evacuated by a vacuum pump to maintain a pressure-decreased state, so that a major portion of the raw material gas flowing in the direction of the arrow B is directed towards the die members 4, flowed in the extrusion grooves 3, exited from the extrusion grooves 3 to the exterior of the die members 4 in a direction as shown by the arrow C, flowed in the gas outlet space 9 through the round outlet holes 12, and discharged from gas the outlet space 9 to the exterior, for example, in a direction as shown by the arrow D, in FIGS. 1A and 1B.

In the method for producing dies for extruding ceramic honeycomb structural bodies according to the present invention, the arrangement of die members 4 of directing the extrusion grooves 3 to face the raw material gas inlet pipe 6 is very important. In such an arrangement, the state of the raw material gas, such as, concentration, reactivity, etc., is considerably different between the upstream side and the downstream side, as described in detail in our Japanese Patent Application No. 2-81,385, while the extrusion grooves 3 have considerably smaller cross-sectional area than that of the ceramic batch supplying holes 2, as shown in FIGS. 2A and 2B. Thus, if the raw material gas is flowed from the extrusion grooves 3 in the ceramic batch supplying holes 2, the raw material gas flowing through the extrusion grooves 3 can have a higher flowing speed and a larger flowing rate than those of the raw material gas in case of flowing from the ceramic batch supplying holes 2 in the extrusion grooves 3. Accordingly, the raw material gas can deposit on the surface of the extrusion grooves 3 at a larger deposition rate than that on the surface of the ceramic batch supplying holes 2, for example, twice as much of a deposition rate of the raw material gas on the surface of the extrusion grooves 3 in case of when the die members 4 are arranged such that the ceramic batch supplying holes 2 thereof face the raw material gas inlet pipe 6. Because the raw material gas can have a large deposition rate on the extrusion grooves 3 as described above, a necessary time for obtaining a desired thickness of a coating layer on the die members in performing the CVD treatment can be decreased to, e.g., about half as much as the prior art in order to provide on the extrusion grooves 3 a coating layer of a desired thickness suitable for producing ceramic honeycomb structural bodies having partition walls of a desired thickness. Because the necessary time for performing the CVD treatment can be decreased, the present invention is advantageous not only from an economical viewpoint from increased productivity, but also in decreasing deformation of the die members by virtue of the decreased heating time for the die members.

In the above-mentioned CVD device, an abrasive-resistant material to be coated on the die member by the CVD treatment is preferably at least one of TiC, Ti(CN) and TiN or laminated layers of these materials, and the die member is preferably made of a martensite type precipitation hardened stainless steel. The deposition of the CVD layer is preferably effected at 680°–900° C., more preferably at 680°–850° C. As the reactive gas, preferably use is made of titanium tetrachloride, amine, hydrazine, or nitrile. As typical C-N source materials are included, for example, acetonitrile, trimethylamine, dimethylhydrazine, and hydrocyanic acid, etc. The gas inlet pipe, the bottom plate, and the circumferential side wall are preferably made of graphite from the viewpoints of cost and life.

In the CVD device shown above, the CVD space 16 accommodating the die members 4 is independent from the neighboring CVD spaces adjoining the CVD space 16 from the upper and lower side thereof as explained below, in order to regulate the flow of the raw material gas. Namely, a number of round gas outlet holes 13 which are provided in the bottom plate 17 defining the CVD space 16 of a prior art device are wholly omitted in this embodiment, as shown in FIGS. 1A and 1B, to prevent mutual gas flow between the adjacent CVD spaces. Moreover, the circular gas outlet holes 12 which are provided in an equal distance in the whole circumferential side wall 18 defining the CVD space 16 in the conventional device as shown in FIG. 4, are wholly omitted in this embodiment, except for those positioned behind the rear side of the die members 4 as shown in FIG. 1B. Furthermore, those gas discharge holes 7 of the raw material gas inlet pipe 6 are omitted that do not participate in the vapor deposition on the die members 4. The whole device in this case is similar to a conventional device shown in FIG. 5, except for the above features and that the portion encircled by a dotted line has a plurality of die members 4 (two die members 4 are exemplified in FIG. 5) is arranged according to the fashion of the present invention and stacked in multi stages in the vertical direction. By this arrangement, all the raw material gas supplied in the CVD space 16 through the gas discharge holes 7 of the raw material gas inlet pipe 6 is passed through the die members 4 in the direction as shown by the arrows B and C in FIG. 1A and exited from the die members 4 through the space 9 to the exterior as shown by the arrow D in FIG. 1A, without being deflected and vainly exited from the gas outlet holes 12 and 13 without participating in the vapor deposition as in a conventional device of FIGS. 3 and 4. Therefore, the flow of the raw material gas is restricted solely to the directions of the arrows A, B and C. As a result, turbulence of the gas flow does not occur, and a plurality of the die members 4 can be simultaneously subjected to a CVD treatment to obtain a uniform vapor deposition film on the die members 4, so that the production cost of the die can remarkably be decreased.

In the above embodiment of the CVD device, the size and the position of the gas discharge holes 7 of the raw material gas inlet pipe 6 can be determined arbitrarily. For example, when treating die members of an elliptical shape having an outer diameter of 215 mm × 130 mm by a CVD treatment, the gas discharge holes 7 have a size of a diameter $\phi$ of about 2.5 mm and a number of 3–4, and are positioned on the gas inlet pipe 6 at an equal pitch in the longitudinal direction of the pipe 6 in a symmetrical position relative to the center points of the two die members 4. Also, the size and the position of the holes 12 of the circumferential side wall 18 can arbitrarily be determined, and are preferably a little smaller in size than the gas discharge holes 7 for always filling the raw material gas in the CVD space 16 in order to obtain a uniform vapor deposition film.

Hereinafter, the present invention will be explained in more detail with reference to examples.

EXAMPLE 1

A martensite series precipitation hardened stainless steel produced by Hitachi Kinzoku K.K. (trade name is PSL) was worked by drilling or electrolytic working, etc., to provide bores of a diameter of 1.5 mm on a surface thereof, and extrusion grooves of a width of about 200 μm were formed on the other surface by an electrical discharge working, to prepare a die member of an elliptical shape having a diameter of 215 mm × 130 mm and a thickness of 21 mm. The die member was degreased with an alkaline solution, washed with water, rinsed with an acid solution by using an ultra sonic rinsing, and washed with water to obtain a purified die member. Then, two sheets of the die member were set in a standard type CVD device of Benelux Co. having an outer diameter $\phi$ of 275 mm and a length of 750 mm as schematically shown in FIG. 1A, and subjected to a treatment of coating titanium carbonitride Ti(CN) thereon at a condition of a temperature of 770° C. and a time of 10 hrs. In the coating treatment, however, a non-perforated plate was used as the bottom plate 17, the gas discharge holes 7 of the raw material gas inlet pipe 6 had a diameter $\phi$ of 2.5 mm and were spaced at a pitch of 25 mm, the gas outlet holes 12 bored in the circumferential side wall 12 had a diameter $\phi$ of 2.3 mm and were spaced at a pitch of 25 mm, the die members were arranged in such a fashion that the extrusion grooves thereof face the raw material gas inlet pipe 6, used raw material gases were titanium tetrachloride and acetonitrile, the used carrier gases were hydrogen and nitrogen, flow rates and pressure of the gases were 27.0 l/min and 90 mbar, respectively. As a result, two dies of a uniform aimed thickness as shown in the following Table 1 were obtained respectively at positions U (upper), M (middle) and L (lower) as shown in FIG. 1A. For measuring the thickness of the deposited coating, a measuring device using a fluoro X-ray and having a precision of ±0.2 pm was used.

TABLE 1

| Die No. | Aimed Film Thickness 15 μm | | | |
|---|---|---|---|---|
| | Deposited Film Thickness (μm) | | | |
| | U | M | L | $X_{av}$ |
| Die a | 14.9 | 14.2 | 14.8 | 14.6 |
| Die b | 14.8 | 14.3 | 14.8 | 14.6 |

COMPARATIVE EXAMPLE 1

The coating treatment of Example 1 was repeated in the same condition as in Example 1, except that the used CVD device was that shown in FIGS. 3–5 wherein the courses of the gas flows were not regulated to one direction by the uniform presence of the holes 12 and 13 on the side wall 18. As a result, the obtained film thicknesses are uneven at the positions U, M and L, as shown in the following Table 2.

TABLE 2

| Die No. | Aimed Film Thickness 15 μm | | | |
|---|---|---|---|---|
| | Deposited Film Thickness (μm) | | | |
| | U | M | L | $X_{av}$ |
| Die c | 15.5 | 14.2 | 13.5 | 14.4 |
| Die d | 15.0 | 14.0 | 13.1 | 14.0 |

EXAMPLE 2

The coating treatment of Example 1 was repeated in the same condition as in Example 1, except that a modified CVD device of FIG. 1A was used having additional two die members 4 at a lower stage thereof and the deposition time was changed to 12 hrs. As a result, four sheets of dies were obtained at the upper and lower stages at the above-mentioned U, M and L positions, respectively, having a uniformly deposited film, as shown in the following Table 3. When these dies were used for extrusion, good extrusion bodies were obtained.

TABLE 3

| Stage | Die No. | Aimed Film Thickness 15 μm | | | |
|---|---|---|---|---|---|
| | | Deposited Film Thickness (μm) | | | |
| | | U | M | L | $X_{av}$ |
| Upper | Die e | 14.8 | 14.1 | 14.6 | 14.5 |
| | Die f | 14.6 | 14.2 | 14.9 | 14.5 |
| Lower | Die g | 14.7 | 14.0 | 14.5 | 14.4 |
| | Die h | 14.5 | 14.1 | 14.6 | 14.4 |

COMPARATIVE EXAMPLE 2

Four sheets of the die member 4 were set at the upper and lower stages in the same device as used in Comparative Example 1 and the coating of the die members 4 by vapor deposition were effected in the same condition as in Example 2. As a result, the thickness of the coatings were uneven between the U, M and L positions, and a significant difference of about 5 μm of the coating thicknesses was found particularly between the upper and lower stages, as shown in the following Table 4.

TABLE 4

| Stage | Die No. | Aimed Film Thickness 15 μm | | | |
|---|---|---|---|---|---|
| | | Deposited Film Thickness (μm) | | | |
| | | U | M | L | $X_{av}$ |
| Upper | Die i | 15.0 | 13.9 | 12.9 | 13.9 |
| | Die j | 15.2 | 14.0 | 13.2 | 14.1 |
| Lower | Die k | 10.2 | 9.1 | 8.1 | 9.1 |
| | Die l | 10.0 | 9.2 | 7.9 | 9.0 |

As clearly apparent from the foregoing explanations, the method for producing dies for extruding ceramic honeycomb bodies of the present invention can simultaneously treat a plurality of die members in a vapor deposition device by a chemical vapor deposition, while regulating the raw material gas to be used for the chemical vapor deposition to flow exclusively to the die members, for example, so that a plurality of dies having uniformly deposited films for extruding ceramic honeycomb bodies can be obtained simultaneously thereby to decrease the production cost of the die.

Although the present invention has been described with reference to specific examples and numerical values, it should be understood that the present invention is not restricted to such examples and numerical values, and numerous changes and modifications are possible without departing from the broad spirit and the aspect of the present invention as defined in the appended claims.

What is claimed is:

1. A device for producing dies for extruding ceramic honeycomb structural bodies, by chemical vapor deposition, comprising a chamber for treating at least two die members by the chemical vapor deposition, a raw material gas inlet pipe arranged rotatable in the center of the chamber, the die members having a plurality of ceramic batch supplying holes and a plurality of extrusion grooves communicated with the ceramic batch supplying holes, a number of raw material gas discharge holes provided on the raw material gas inlet pipe and facing the die members, a circumferential side wall arranged in the inner side of the chamber, and at least one raw material gas outlet hole provided on the circumferential side wall solely behind each of the die members.

2. The device of claim 1, further comprising a gas outlet space provided between the chamber and the circumferential side wall for evacuating the raw material gas to the exterior of the device by a vacuum pump.

3. The device of claim 1, wherein the chamber is provided in multiple stages for stacking one stage on another stage for performing the chemical vapor deposition treatment simultaneously and uniformly on die members contained in the multiple stages in one operation.

* * * * *